United States Patent [19]

Pellegrino

[11] 3,928,692

[45] Dec. 23, 1975

[54] COMPOSITE PLATING TAPE

[76] Inventor: Peter P. Pellegrino, 2762 Shields Court, Thousand Oaks, Calif. 91360

[22] Filed: May 2, 1973

[21] Appl. No.: 356,481

[52] U.S. Cl. .................... 428/54; 428/41; 428/42; 428/77; 428/352

[51] Int. Cl.² .................... B32B 3/16

[58] Field of Search .......... 161/36, 167, 406, 406 T; 117/122 R, 122 P; 428/40, 41, 42, 54, 77, 352

[56] References Cited

UNITED STATES PATENTS

| | | | |
|---|---|---|---|
| 2,808,358 | 10/1957 | Masse | 161/406 |
| 3,132,204 | 5/1964 | Giellerup | 117/122 P |
| 3,194,717 | 7/1965 | Albert | 161/406 |
| 3,194,718 | 7/1965 | Offensend | 161/406 |
| 3,201,301 | 8/1965 | Offensend | 161/406 |
| 3,475,259 | 10/1969 | Meserole | 161/406 |
| 3,581,884 | 6/1971 | Caldwell et al. | 206/59 |
| 3,825,463 | 7/1974 | Amann | 428/41 |

*Primary Examiner*—Thomas J. Herbert, Jr.
*Assistant Examiner*—Bruce H. Hess

[57] ABSTRACT

A composite plastic adhesive plating tape, comprised of multiple sections of tape arranged and configured in two or more layers and held in stable spatial relation to one another by the adhesiveness of adjoining surfaces. The present invention may be made conductive by having integral thereto a conductive section made from a strip of metal foil. Non-conductive embodiments of the present invention may be used advantageously in electro-plating applications, and in particular, in electro-plating the contact fingers of electronic printed circuit boards. In such application, the present invention saves substantial labor expense and practically eliminates the risk of error in plating over regions of copper which are unavoidably exposed during the pre-plating step of stripping lead-tin from the contact fingers. In addition, the present invention makes possible a substantial reduction in the loss of the precious metal used in electro-plating the contact fingers of circuit boards. Non-conductive embodiments of this invention effectively prevent, during the plating of the contact fingers, the unnecessary plating of the electrical buss regions of the circuit boards which are required to connect the contact fingers to an external source of power. Since the buss regions are typically trimmed off the boards after the plating operation, any precious metal plated thereon is usally lost. Conductive embodiments of this invention avoid the problem of precious metal loss entirely by eliminating the need for having a buss region on the board at all. In addition, conductive embodiments enable the electro-plating of electrically isolated or inaccessible regions of a plating application, such as, for example, the plating of internal regions of a printed circuit board, in an easier and more economical manner than has heretofore been possible.

10 Claims, 20 Drawing Figures

COMPOSITE PLATING TAPE

BACKGROUND OF THE INVENTION

1. Field of the Invention

This invention relates to plating tapes used in electroplating operations, and, more particularly, to conductive and non-conductive composite plating tapes, used in the plating of electronic printed circuit boards.

2. Prior Art

Printed circuit boards are used extensively in the electronics industry. They are found in numerous commercial products, military and space systems and in digital computers. In construction, a printed circuit board is typically comprised of a plastic board having selected portions of one or both of its surfaces plated, in a particular configuration, with thin layers of a lead-tin alloy over copper. The regions of copper provided the electrical interconnecting means; the lead-tin alloy enhances solderability to the board; and the configuration of plated regions satisfies the particular interconnection requirements for which the board was designed. The configuration of plated regions is often referred to as the "circuit intelligence" of the board. Conventional silk-screening and photo-resist techniques are typically used for plating the layers of copper and lead-tin alloy in the required configuration.

In order for a circuit board to be electrically connected to other portions of the assembly or system of which it is a part, it must be adapted to make contact with electrical connecting means. For this purpose, most printed circuit boards have, in addition to the circuit intelligence, precision metal contact fingers plated thereon. These contact fingers are inserted into the connecting means and make electrical contact with corresponding conducting surfaces of the connecting means. The metal contact fingers are typically comprised of a thin layer of copper under layers of gold, nickel or other precious metal.

In the course of fabricating printed circuit boards, the copper regions which typically comprise the contact fingers are initially covered with a layer of lead-tin alloy along with regions constituting the circuit intelligence. Consequently, it is necessary to remove the lead-tin alloy layer from the contact fingers, i.e., to expose the copper thereof, before gold or other metal is plated over them. The removal of the lead-tin alloy from the copper contact fingers, typically by an acid etch, must be accomplished without disturbing the lead-tin layer covering the circuit intelligence. In the prior art the method used has been to apply, before etching, a narrow adhesive plastic tape over a portion of the circuit intelligence so that one edge of the tape runs along the interface between the circuit intelligence and the contact fingers. The purpose of the tape is to provide a barrier to the stripping solution, thereby keeping it from reaching the lead-tin over the circuit intelligence. The tape is resistant to the stripping solution which is used to remove the lead-tin layer covering the contact fingers.

Notwithstanding the presence of the plastic tape, however, some stripping solution gets under the tape edge and removes, in a random manner, a portion of the lead-tin alloy over the circuit intelligence near the interface with the contact fingers. This is referred to in the trade as "undercutting." The result of undercutting is an irregular, narrow region of exposed copper in the circuit intelligence. If left exposed, the copper would be subject to intermetallic corrosion, especially in a high temperature and/or high humidity environment. This causes problems in the field and decreases the reliability of the circuit board. To overcome the problem of undercutting, the prior art teaches the removal of the tape and its replacement with a second tape, typically set back (i.e., in a direction away from the contact fingers) about 1/16 inch from where the edge of the first tape was located. In this manner, the undercut region of lead-tin, i.e., the exposed copper in the circuit intelligence, is uncovered; thus, in the subsequent step of plating the contact fingers, the exposed copper region will likewise be plated over, typically with layers of gold and nickel.

This prior art solution to the problem of undercutting has several significant shortcomings. For one thing, the second tape is typically laid down manually in order to line up its edge so as to have the proper set back. As a consequence, additional labor must be expended. Further, the process of laying down plating tape is relatively slow, which tends to increase the cost of labor. In addition, notwithstanding the care taken, it is possible in many applications for the operator to misalign the second tape so as to either prevent the gold-nickel plating of some portions of the undercut region, or, at the other extreme, to cause excessive overlapping of the gold-nickel plating onto the circuit intelligence. Although some simple tape dispensing machines are available which lay tape down automatically (using line-up or pre-located pins on the board for proper alignment) such machines have the disadvantage of requiring a capital investment. In addition, their use does not appreciably accelerate the process, since, either manually or by machine, the prior art method inherently involves three sequential steps, i.e., the laying down of the first tape, its removal and the laying down of the second tape, properly aligned.

The present invention overcomes the above-described shortcomings of the prior art encountered in connection with the problem of undercutting by providing a composite plastic plating tape which automatically provides, in a sequential manner, the first and second suitably displaced tape edges required to plate over the undercut region of the adjacent circuit intelligence when plating the contact fingers. With this invention, the step of removing the first tape rapidly and automatically yields the second tape edge, accurately aligned, to extremely close tolerances.

The plating of the contact fingers is typically accomplished by conventional electro-plating techniques. For the purpose of providing electrical conduction from an external power supply to the contact fingers, an electrical buss, typically comprised of lead-tin over copper and contiguous with the contact fingers, is deposited on an extended portion of the circuit board. After completion of the electro-plating step, when the buss is no longer needed, the extended portion of the circuit board is cut off in order to achieve the required dimensions of the board.

Since the buss is contiguous with the contact fingers, its lead-tin layer is typically stripped during the stripping of the lead-tin alloy from the contact fingers. In addition, by the methods of the prior art, the copper buss is typically gold-nickel plated, along with the contact fingers, during the electro-plating step. The stripping and replating of the buss has several disadvantages and shortcomings. The first and most significant disadvantage is the loss of the gold plated onto the buss when the buss is subsequently cut off. Millions of circuit boards are fabricated in the United States annually. By the methods of the prior art, therefore, millions of dollars worth of gold are cut away annually in the buss trimmings. This gold is usually lost; where practical, however, it may be reclaimed, but at additional expense. A second disadvantage of the prior art methods in this regard is the weakening of the lead-tin stripping solution by the removal of the lead-tin layer on the buss region of the board.

The present invention overcomes the above-described disadvantages of the prior art encountered in connection with the use of an electrical buss for connecting the contact fingers to an electrical power source during the plating step. One preferred embodiment of this invention is a composite plastic plating tape which, when laid down over the circuit board, covers the buss portion thereof, while automatically providing, in proper sequence, the first and second tape edges to ensure the removal of the lead-tin from the contact fingers only, and the subsequent plating of the undercut region of the circuit intelligence. By so covering the buss, the lead-tin layer thereon is shielded from the lead-tin stripping solution. In addition, during the gold-nickel plating process, the buss is not plated, and thereby no gold is lost when the buss is trimmed away. The advantage of this embodiment of the present invention over merely laying down a strip of plating tape over the buss region lies in the saving of labor which it makes possible. The laying down of a tape over the buss requires an additional operation and careful alignment, whether done manually or by machine. This embodiment, on the other hand, in a single application, covers the buss and, at the same time, sets up the first and second tape edges for the sequential steps of stripping and plating the contact fingers.

The use of a buss region on the circuit board for conduction during the electro-plating process has still another disadvantage. Since the buss portion of the board is cut off after the plating process is completed, a portion of copper is exposed along the cut edge of the board, typically a beveled edge. Such exposed copper makes the circuit board more susceptible to corrosion and, therefore, unacceptable in certain applications. Another embodiment of this invention overcomes this disadvantage of the prior art method by providing a composite plastic plating tape which has electrically conducting means integral thereto. Such conducting means provide the electrical connection between the power source and the contact fingers during the plating operation, thereby eliminating the requirement for a buss. Without a buss, the circuit board no longer has to be trimmed after the plating of the contact fingers is completed. Consequently, the edge of the board is plated at the same time the contact fingers are plated. Thus, circuit boards fabricated using the conductive tape embodiment of this invention do not have copper exposed along their beveled edges.

A further advantage of the conductive tape embodiment of this invention lies in its making possible the electro-plating of contact fingers which are set back from the edge of the board. Heretofore, such circuit boards required a buss and circuit connection between each contact finger and the buss for the electro-plating process. The conductive tape embodiments, by providing a conducting means across the contact fingers, eliminates the need for the buss and for the circuit connections thereto. Similarly, the conductive tape embodiment enables the electro-plating of internal or isolated regions of a circuit board, or other comparable plating application, by making it possible to connect such otherwise inaccessible regions to an external power source.

Thus, the present invention substantially overcomes significant disadvantages and shortcomings of the prior art. It achieves circuit boards of higher quality with more economy than has heretobefore been attainable.

BRIEF SUMMARY OF THE INVENTION

The present invention is a composite plastic adhesive tape comprised of adjacent sections of tape configured in at least two layers. The sections are disposed adjacent to one another in a direction transverse to their longitudinal dimension. The width of the layers are substantially equal. The composite tape is configured so that the line of engagement of each pair of adjacent sections always falls within the surface area of an adjoining section of tape in an immediately adjacent layer. In this manner, the pairs of adjacent sections of tape are kept from separating by virtue of the adhesiveness of the surfaces of the tape. The composite tape disclosed herein may be made conductive by the inclusion of a strip of electrically conductive material, typically copper foil, in at least one of the layers of composite tape.

A first embodiment of this invention is comprised of two layers, the upper layer consisting of two adjacent sections of tape and the lower layer consisting of three sections. In a process for stripping a first metal from a surface to be plated and the subsequent plating of the surface with a second metal. This embodiment automatically provides, in a sequential manner, a first tape section to serve as a barrier during the stripping operation and then an accurately displaced second section to serve as a barrier during the plating operation. The displacement ensures that the second metal plated onto the surface will overlap the first metal thereon. In the fabrication of electronic circuit boards, this embodiment makes possible an improved method for stripping the lead-tin from the copper contact fingers of the board and for replating such fingers with layers of nickel and gold so as to cover any copper unavoidably exposed during the stripping operation. The accurate and automatic displacement of the second section with respect to the first saves time and money and ensures the overlap necessary to overcome the exposure of copper due to undercutting.

A second embodiment of this invention provides, in addition to the accurately displaced tape sections provided by the first embodiment, another tape section which automatically covers the electrical buss region of a circuit board during the stripping and plating operations. The buss region is typically required in order to provide electrical conduction to the contact fingers during the plating operation. By covering the buss region, the layer of lead-tin alloy covering the copper is not stripped off, and, secondly the buss region is not plated with the nickel and gold, or other precious metal, with which the contact fingers are plated. Ordinarily, the buss region is removed after the plating operation is completed. By preventing the plating of the buss region, therefore, this embodiment substantially eliminates the loss of the gold which otherwise occurs when the buss is removed.

Conductive embodiments of the present invention enable the connection of electrical power to the surface to be plated, thereby eliminating entirely the need for an electrical buss region with its attendant disadvantages. Conductive embodiments of this invention also enable the electro-plating of electrically isolated surfaces in many plating applications.

Other objects, novel features and advantages of the present invention will become apparent upon making reference to the following detailed description and the accompanying drawings. The description and the drawings will also further disclose the characteristics of this invention, both as to its structure and its mode of operation. Although preferred embodiments of the invention are described hereinbelow, and shown in the accompanying drawing, it is expressly understood that the descriptions and drawings thereof are for the purpose of illustration only and do not limit the scope of this invention.

A BRIEF DESCRIPTION OF THE DRAWINGS.

FIG. 1 is a front perspective view of a first nonconductive embodiment of the present invention.

FIG. *2a* is a top-elevational view of a portion of a printed circuit board with conventional plating tape applied thereto, prior to stripping of lead-tin alloy from contact fingers.

FIG. *2b* is a cross-sectional view of the configuration shown in FIG. *2a*.

FIG. *3a* is a front-elevational view of the circuit board of FIG. *2a* showing the exposed region of copper caused by undercutting during the lead-tin stripping operation.

FIG. *3b* is a cross-sectional view of the configuration shown in FIG. *3a*.

FIG. *3c* is an enlarged front-elevational view of a portion of the undercut region shown in FIG. *3a*.

DETAILED DESCRIPTION OF THE INVENTION.

Figures 1, 2A, 2B, 3A, 3B, 3C:
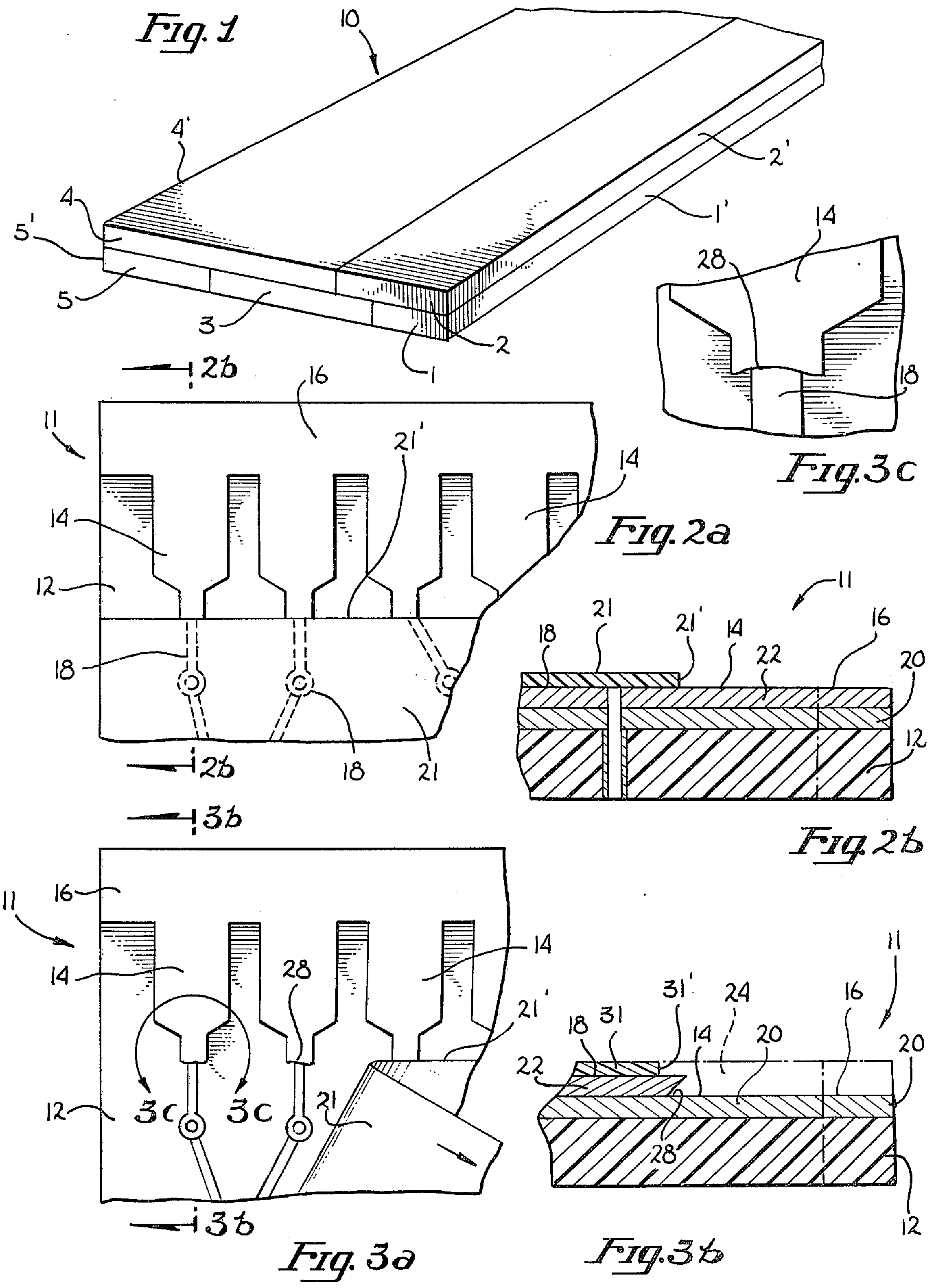

With reference to FIG. 1, a first preferred embodiment of the present invention 10 is described in detail. It is comprised of five discrete components or sections of plastic adhesive tape, 1–5, configured in two layers. The lower layer is comprised of sections 1, 3 and 5, located adjacent to one another in a direction transverse to their longitudinal dimension, section 3 being located between sections 1 and 5. The upper layer is comprised of sections 2 and 4, likewise located adjacent to one another in the transverse direction. The edges 4' and 5' of sections 4 and 5, respectively, are aligned along their entire lengths so as to form a planar surface from the bottom of section 5 to the top of section 4. Similarly, the edges 1' and 2' of sections 1 and 2, respectively, are aligned along their entire length to form a planar surface from the bottom of section 1 to the top of section 2. Section 4 overlaps the interface between sections 3 and 5, and, by virtue of the adhesion between section 4 and sections 3 and 5, the latter sections are kept from separating. Similarly, section 2 overlaps the interface between sections 1 and 3, and, by virtue of the adhesion between section 2 and sections 1 and 3, the latter sections are kept from separation. As a consequence of the above-described arrangement, the interface between sections 2 and 4 falls over section 3, and, by virtue of their adhesion thereto, sections 2 and 4 are kept from separating. In this manner, the five sections 1–5, are maintained securely in the spatial relationship which enables composite plating tape 10 to be use advantageously in circuit board applications, as more fully disclosed hereinbelow.

Composite tape 10 is used in connection with the fabrication of printed circuit boards, and more specifically, in connection with the making of the metallic contact fingers used for interconnecting the circuit board to the remainder of the electronic assembly. The composite tape 10 solves the problem of undercutting, encountered in the making of the contact fingers, in a more effective and economical manner than has heretofore been possible. To enhance an understanding of how composite tape 10 is used and an appreciation of its advantages, the problem of undercutting, and the prior art method of overcoming it, are described with reference to FIGS. *2a–2b* and *3a–3c*. In these FIGURES and in all subsequent FIGURES, like elements will be designated by the same numerals.

FIG. *2a* shows a portion of a plastic circuit board 11 as it appears at a point in time prior to the completion of the board's interconnecting contact fingers 14. At this stage in its fabrication, the board 11 is comprised of a stiff plastic sheet 12 having deposited thereon a plurality of contact fingers 14, a buss region 16 and region 18, characterized as the circuit intelligence. Regions 14, 16 and 18 are comprised of a layer of conducting metal, typically copper 20, covered by a layer of a lead-tin alloy 22, the latter providing a pretinning medium for improved solderability. The contact fingers 14 will ultimately be comprised of layers of surface metals 24, such as nickel and gold, plated over the copper 20. The surface metal 24 is not limited to nickel and gold, but may be an alloy thereof, or alloys of other precious metals such as silver and rhodium. For the purpose of this description, the surface metal 24 will be assumed to be gold plated over nickel, and will be referred to hereinafter as "gold-nickel."

Prior to plating gold-nickel layer 24 onto the copper 20 of contact fingers 14, it is necessary to remove the layer of lead-tin alloy 22 therefrom without disturbing the lead-tin layer 22 on the regions of circuit intelligence 18. In order to accomplish this by the methods of the prior art, a strip of plating tape 21 is laid across the circuit intelligence 18 so that its edge 21' lies along the interface between the contact fingers 14 and the circuit intelligence 18. The board 11 is then placed in a commercially available lead-tin stripping solution, such as produced by McDermid Corporation. The stripping solution etches away the layer of lead-tin alloy 22 from the contact fingers 14 (and also from the buss region 16). During the step of stripping the lead-tin layer 22 from the contact fingers 14, tape 21 substantially protects the circuit intelligence 18 from the stripping solution. However, some of the stripping solution inevitably penetrates under the bottom of tape edge 21' and removes, in a random manner, a small portion of the lead-tin alloy 22 which covers the copper 20 of circuit intelligence 18. The removal or "undercutting" of the layer of lead-tin 22 under the edge 21' of tape 21, along its entire length, is shown in FIGS. 3*a*–3*c*. The result is an irregular region 28 of exposed copper 20 of the circuit intelligence 18. The region of exposed copper 28 is highly undesirable in a circuit board in that the copper 20 is subject to corrosion, especially in a high humidity and/or high temperature environment. Corrosion of the copper 20 will degrade the quality and reliability of the board 11.

In order to eliminate the irregular region of exposed copper 28, the prior art method teaches the removal of tape 21 and the laying down of a second tape 31 with its edge 31' parallel to and set back from where the edge 21' of the first tape 21 had been. The amount of set back is typically in the range from 1/16 – ⅛ inch. This spatial relationship between the second tape 31 and the circuit board 11, and particularly with respect to the region of exposed copper 28, is shown in FIG. 3*b*. The purpose of setting back the edge 31' of tape 31, as described, is to allow the layer of gold-nickel 24, which is to be plated over the contact fingers 14, to overlap the region of exposed copper 28. In this manner, the adverse potential for corrosion, caused by the undercutting of the layer of lead-tin 22 beneath the tape edge 21, is effectively counteracted.

A substantial disadvantage of the above-described method of overcoming the phenomenon of undercutting lies in having to properly align the second tape 31 so as to yield the desired overlap during the subsequent gold-nickel plating step. As discussed above, this additional and critically important step increases the labor which must be expended in circuit board production, and, therefore, the cost. The first preferred embodiment 10 of this invention overcomes this shortcoming of the prior art as described with reference to FIGS. 4–8.

Composite tape 10 is laid down on circuit board 11 in the following manner: Section 2 is first pulled away from section 3. At the same time, section 1, which is affixed to section 2 by the adhesive bond, is pulled away along with section 2. The remaining sections 3, 4 and 5, are laid down with the now open edge 3' of section 3 being aligned, in the longitudinal direction, along the interface between the contact fingers 14 and the circuit intelligence 18 as shown in phantom lines in FIG. 4. Section 3 provides a barrier to the stripping solution during the process of removing the layer of lead-tin alloy 22 from the contact fingers 14. Section 3, therefore, serves the same purpose as that of first tape 21 in the prior art method described above with reference to FIGS. 2*a*, 2*b* and 3*a*. In addition, sections 1 and 2 are not discarded, but, rather, they are used advantageously by laying them down over the buss region 16, as shown in FIGS. 5–8. These sections, thus applied, provide a barrier between the buss region 16 and the stripping solution, thereby lessening the weakening of the solution; and, secondly, these sections prevent the gold-nickel plating of buss region 16 during the subsequent plating step, thereby reducing substantially the loss of gold when the buss region 16 is cut off the circuit board 11. The width of section 2 is selected to be substantially equal to the width of buss region 16 plus the width of the cutting tool, typically 1/16–⅛ inch.

Figures 4, 5, 6:
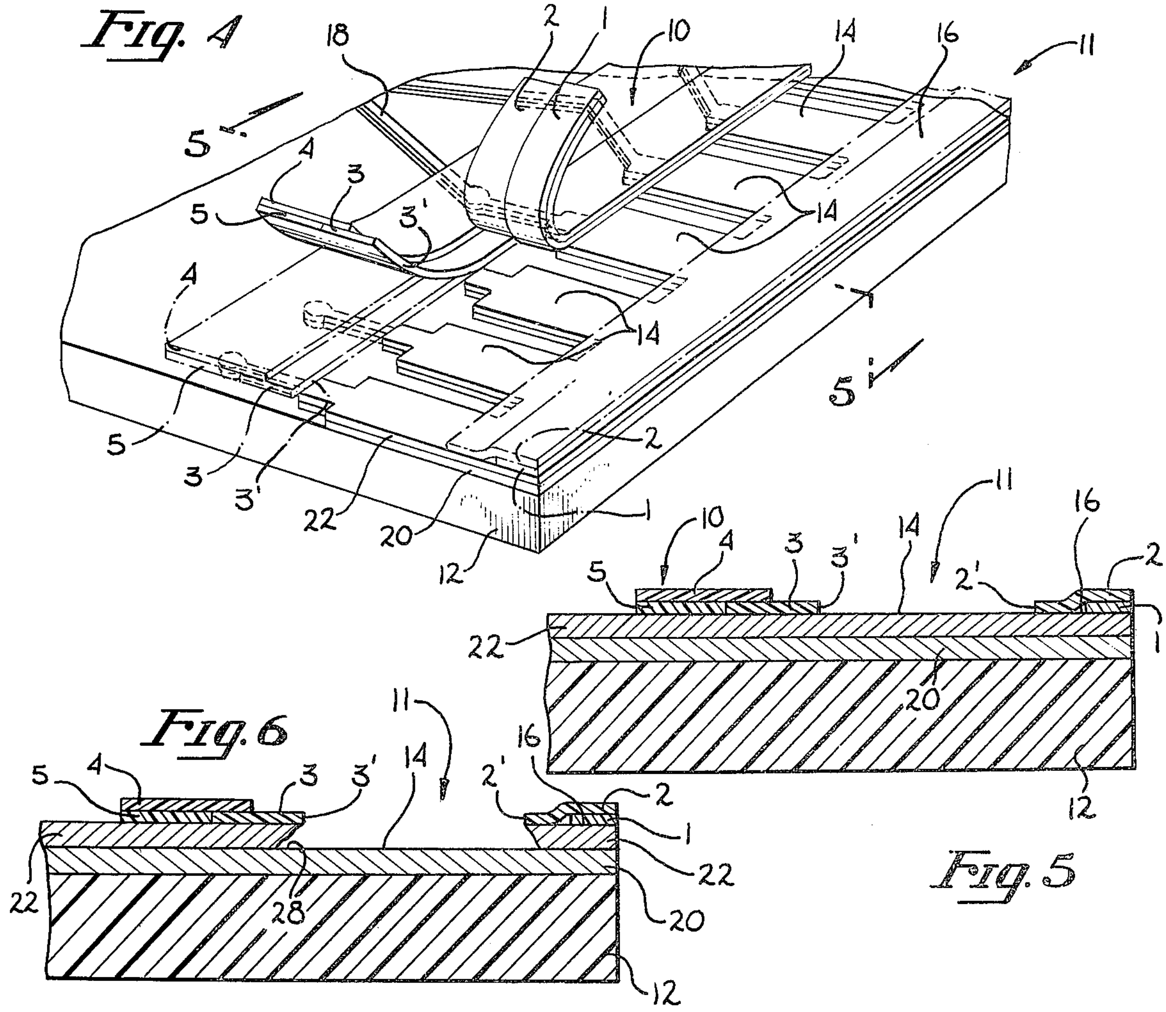
FIG. 4 is a front perspective view showing the manner in which the embodiment of FIG. 1 of the present invention is laid down upon a portion of a circuit board.
FIG. 5 is a cross-sectional view of the configuration shown in FIG. 4.
FIG. 6 is a cross-sectional view of the configuration shown in FIG. 4 after the stripping of the lead-tin from the contact fingers.

The circuit board 11 is next placed into the stripping solution and the contact fingers 14 are scrubbed with any one of a number of commercially available abrasive media, such as, for example, plastic wool, bronze or copper scrub brushes, pumice or an aluminum oxide preparation. The contact fingers 14 are scrubbed until the layer of lead-tin alloy 22 is removed and the copper 20 thereunder is exposed. The circuit board 11 is then rinsed in water and dried. The condition of the circuit board 11 after it is removed from the stripping solution and cleaned is shown in FIG. 6.

Figures 7, 8:
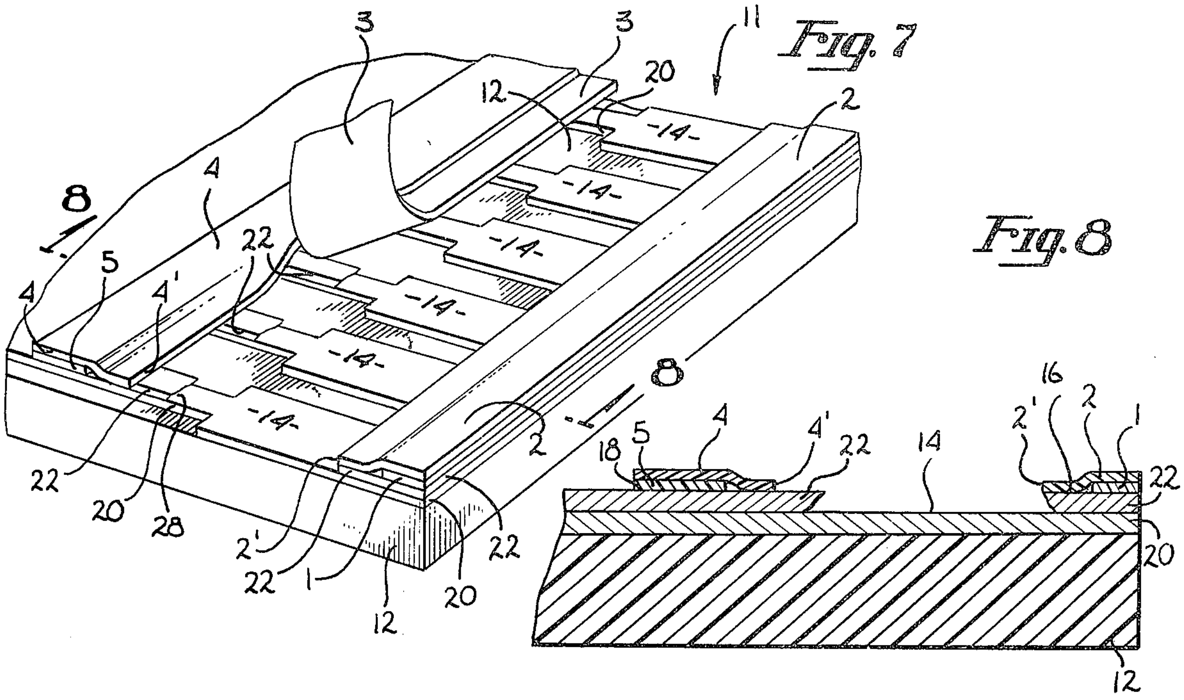
FIG. 7 is a front perspective view showing the manner in which the present invention automatically achieves an accurate set back of tape prior to the plating of the contact fingers.
FIG. 8 is a cross-sectional view of the configuration shown in FIG. 7.

As a consequence of the inevitable seepage of stripping solution under edge 3', an irregular region of unwanted, exposed copper 28 appears under section 3 across the circuit intelligence region 18 of the circuit board 11. As discussed above, the adverse result of such undercutting is overcome by plating over the exposed region of copper 28. The present invention automatically provides the precise amount of plating overlap for this purpose by simply lifting section 4, pulling out and removing entirely section 3 and laying down section 4, as shown in FIGS. 7 and 8. The composite tape 10 is designed so that the amount by which section 4 overlaps section 3 is precisely the desired amount of plating overlap; i.e., the amount by which the gold-nickel plating 24 will extend past the line formerly defined by edge 3' in the direction of the circuit intelligence 18. Thus, no matter how irregular the exposure of copper is due to undercutting, the precise set back of section 4 can be selected to insure that the exposed copper 28 is plated over.

The next step in the fabrication of the circuit board 11 is the gold-nickel plating of the contact fingers 16 by conventional electro-plating techniques. The contact fingers 14 are electrically connected to an external power source (not shown) through the buss region 16 by means of connections made thereto (also not shown). The circuit board is then immersed sequentially into nickel and gold baths, in that order, up to but not past edges 4' and 5'. When the external power source is turned on, the electro-plating of the contact fingers 14 takes place. Layers of gold and nickel are plated over the copper 20 of the contact fingers 14 and over the copper region 28 undesirably exposed by the undercutting of the stripping solution. In addition, gold-nickel is also plated over edge 27 of the lead-tin layer 22 which covers the circuit intelligence 18. Gold-nickel plating does not reach the circuit intelligence 18 past the edge 4′ of section 4.

Figure 9:
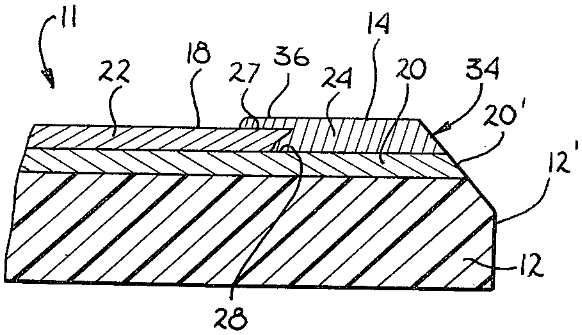
FIG. 9 is a cross-sectional view of a portion of the completed circuit board following plating of the contact fingers and trimming off of the buss region thereof.

Thus, section 4 performs the same function as that of the second tape 31 in the prior art method described hereinabove with reference to FIG. 3*b;* unlike tape 31, however, section 4 is automatically laid down with proper alignment by simply pulling out section 3, thereby eliminating the step of laying down an additional tape with its attendant delay and expense. In addition, section 2 limits the plating up to its edge 2′. Thus, as indicated above, buss region 16 is not plated and no gold is lost when it (buss region 16) is cut off following completion of the plating operation. FIG. 9 shows a cross section of a portion of the circuit board 11 after completion of the above-described steps. The contact fingers 14 are comprised of layers of gold and nickel 24 over copper 20, while the circuit intelligence is comprised of layers of lead-tin 22 over copper 20. A small amount of gold plating 36 overlaps edge 27 of the lead-tin layer 22. By virtue of the overlap 36, the region of copper 28 beneath the undercut portion of the lead-tin 22, which region 28 would otherwise be exposed, is completely covered by gold-nickel 24. The circuit board 11, depicted in FIG. 9, has a beveled edge 34 cut after the buss region 16 has been trimmed off.

It is apparent from the manner in which the composite tape 10 is used that it must be capable of physically withstanding the acidity of the stripping solution, the scrubbing of the board 11 during the lead-tin stripping process, the water rinse and the relatively high temperatures and chemical action encountered when immersed in the plating baths during the electro-plating process. It is of great importance that the spatial relationship between the sections 1–5 of the composite tape 10 be maintained, since their alignment determines the desired overlap 36 of the gold plating. If the tape stretched, lost its adhesive characteristics or became physically altered in some other way, it would lose its usefulness in the process. Water-proof, plastic adhesive tapes which can physically withstand the environments to which the invented composite tape 10 will be subjected are commercially available and known in the trade. One such suitable waterproof, acid resistant plastic tape is manufactured by Minnesota Mining & Manufacturing Co. and sold as Plating Tape No. 470.

Figure 10:
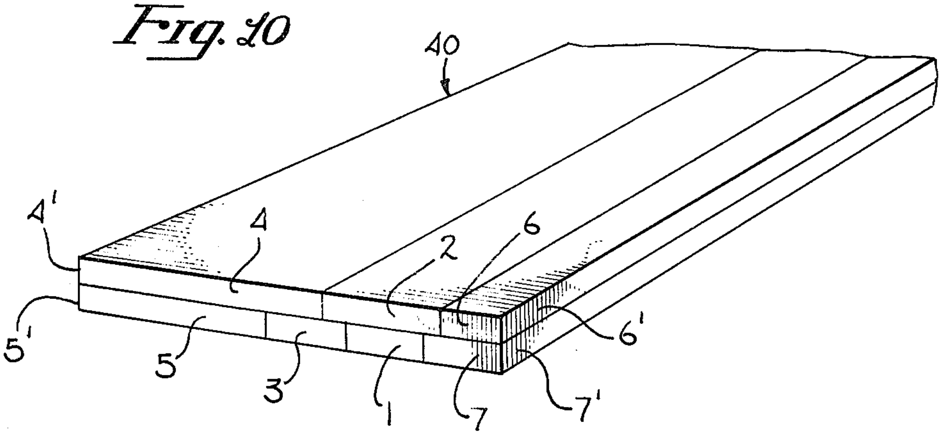
FIG. 10 is a front perspective view of a second nonconductive embodiment of the present invention.

A second preferred embodiment 40 of the present invention is shown in FIG. 10. It is comprised of seven sections, 1–7 of suitable plastic adhesive tape configured in two layers. The lower layer is comprised of sections 1, 3, 5 and 7, located adjacent to one another in the transverse direction, sections 5 and 7 being at the two ends thereof, respectively, and sections 1 and 3 thereinbetween as shown. The upper layer is comprised of sections 2, 4 and 6, likewise located adjacent to one another, section 2 being located between sections 4 and 6. In the same manner as described above with respect to embodiment 10, the edges 4′ and 5′ of sections 4 and 5, respectively, are aligned along their entire length so as to form a planar surface. Similarly, edges 6′ and 7′ of sections 6 and 7, respectively, are also aligned to form a planar surface. These sections of composite tape 40 are held together in their desired spatial relation by virtue of their adhesiveness and the fact that the interface between each pair of adjacent sections is always located over or under another section of tape, the latter thereby securing the interfacing pair of sections and preventing their separation.

Figures 11, 12:
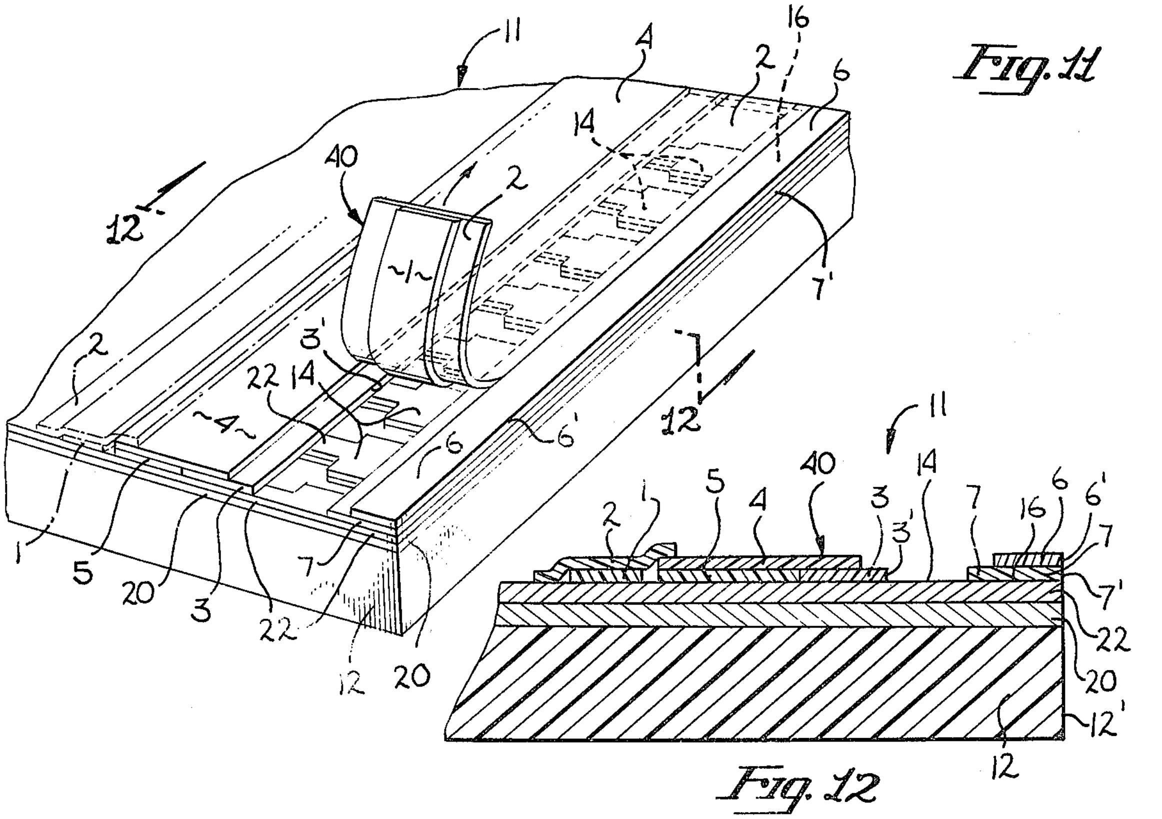
FIG. 11 is a front perspective view showing the manner in which the embodiment of FIG. 10 is laid down upon a portion of a circuit board.
FIG. 12 is a cross-sectional view of the configuration shown in FIG. 11.

The advantage afforded by use of composite tape 40 is now described with reference to FIGS. 11 and 12. Composite tape 40 is laid down so that edges 6′ and 7′ of sections 6 and 7, respectively, are aligned with edge 12′ of the stiff plastic sheet 12. Section 2 is first peeled back. Section 1, which is affixed to section 2 by virtue of the adhesive bond thereinbetween, is pulled back along with section 2, as shown in FIG. 11. This exposes the contact fingers 14, which is necessary for the lead-tin stripping and subsequent plating steps. However, the buss region 16 remains covered by sections 6 and 7 of the composite tape 40, while sections 3, 4 and 5 thereof are in their proper positions to achieve, simply and automatically, the overlap of gold plating over the portion of copper which will be exposed by the undercutting of the lead-tin layer 22 just beneath the edge 3′ of section 3. It is preferable that the width of section 7 be sufficient to extend about 1/16–⅛ inch over the leading edge of the contact fingers 14, since such edge is pulverized by cutting tool which removes buss region 16. In this way, the loss of gold is further reduced. Sections 1 and 2 of composite tape 40 need not be discarded, and, therefore, wasted. These sections are readily lapped over sections 4 and 5 so as to cover an additional portion of the circuit intelligence 18. Such coverage of the circuit intelligence 18 is advantageous during the stripping and plating operations when the circuit intelligence 18 is subjected to the acid stripping solution, the abrasive scrubbing and the metallic plating bath.

FIG. 12 shows the spatial relationship between the sections of tape, 1–7, and the circuit board 11 after sections 1 and 2 are removed and relocated over sections 4 and 5. From this point, the description of how the remaining tape sections are used in connection with the stripping and plating of the contact fingers 14 is the same as that provided above with respect to the first embodiment of this invention, namely, composite tape 10. The principal advantage of composite tape 40 is that it eliminates the step of laying down tape over the buss region 16. As discussed above with respect to composite tape 10, sections 1 and 2 thereof, after being separated and removed from sections 3–5, are laid down over the buss region 16 in order to prevent the sequential stripping and plating of the buss region 16 and its resulting loss of gold and weakening of the stripping solution. Composite tape 40, on the other hand, automatically covers the buss region with its sections 6 and 7. No further laying down of tape is necessary.

A third preferred embodiment of the present invention includes a conductive section C within the composite tape 50. The conductive section C is typically a thin narrow strip of copper foil which can be incorporated as an integral part of any composite tape constructed in accordance with the teachings of this invention. The purpose of the conductive section C is to provide a means for bringing electrical current to a region which is to be electro-plated. In the field of circuit board fabrication, the capability of conducting electrical current through a section of the composite tape 50 eliminates the need for having a buss region 16 on the board. The elimination of the buss region 16 substantially eliminates the loss of gold or other precious metal when the buss region 16 is subsequently cut off. In addition, it enables beveled edge 34, of circuit board 11 to be plated at the same time the contact fingers 14 are plated. This eliminates the exposed copper edges 20′, seen in FIG. 9, which are the result of having to cut off the buss region 16 after the plating operation is completed. Of additional importance is the fact that plating over the beveled edge 34 ensures mechanical integrity from the copper base to the surface of the gold. This substantially reduces the risk of separation of the gold-nickel from the copper, especially during the insertion and retraction of the board from a connector.

Figure 13:
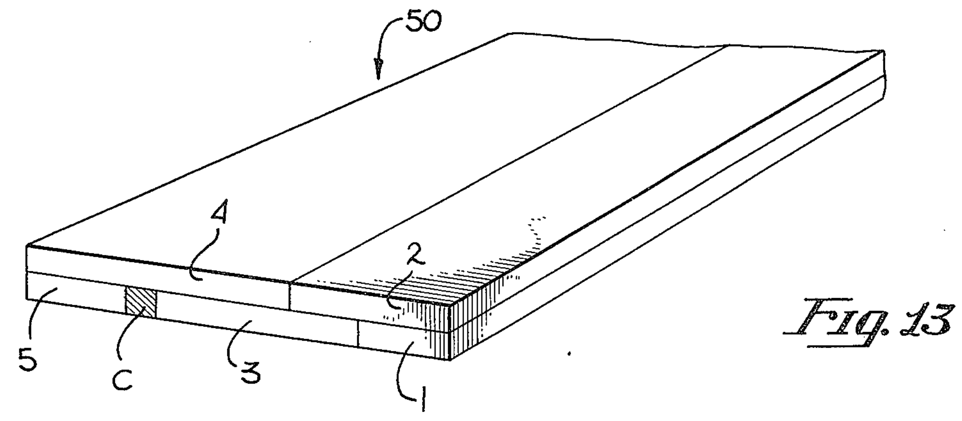
FIG. 13 is a front perspective view of a third conductive embodiment of the present invention.

Composite tape 50 and a method of using it are now described with reference to FIGS. 13–15. It is basically a conductive version of composite tape 10. It should be understood that composite tape 40 can also be made conductive in the manner described herein.

The structure of composite tape 50 is substantially identical to that of composite tape 10 with one exception; conductive section C is disposed between sections 3 and 5 in the lower layer. It is held in place by the adhesive bond provided by section 4. Space for section C is provided by narrowing section 5. This leaves undisturbed the spatial relationship between sections 3 and 4, which relationship determines the overlap 36 of gold over the unwanted, exposed region of copper 38, as discussed more fully hereinabove.

Figure 14:
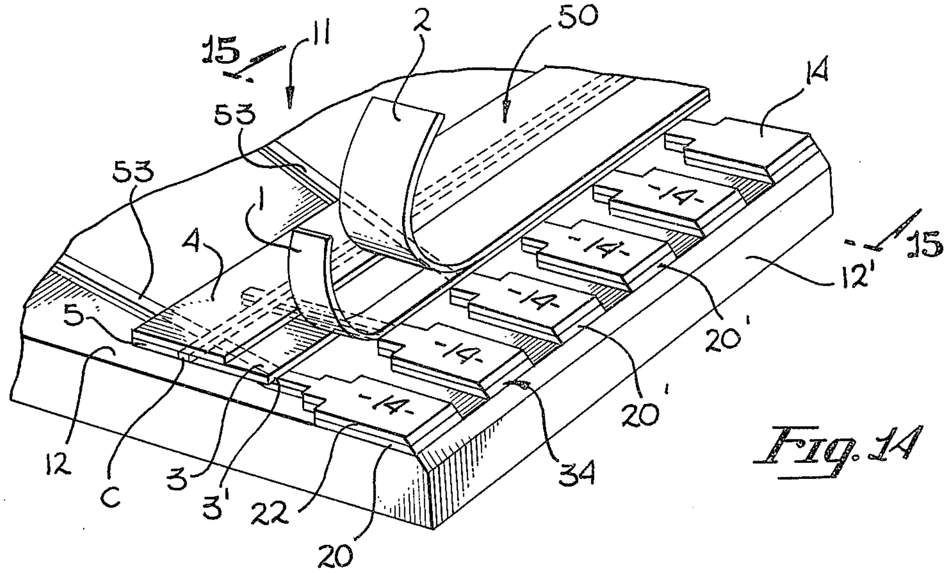
FIG. 14 is a front perspective view showing the manner in which the emobidment of FIG. 13 is laid down upon a portion of a circuit board.
Figure 15:
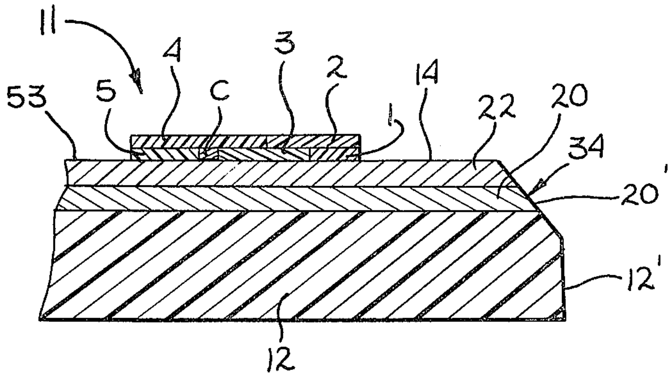
FIG. 15 is a cross-sectional view of the configuration shown in FIG. 14.

FIGS. 14 and 15 show composite tape 50 laid down on a circuit board 11, while sections 1 and 2 are being removed. Composite tape 50 is initially laid down so that, upon removal of sections 1 and 2, edge 3′ of section 3 thereof lies along the interface between the contact fingers 14 and the circuit intelligence 18. Since conductive composite tape 50 is being used, it should be noted that circuit board 11 has no buss region 16. Plastic sheet 12 has previously been cut to the required dimension and a beveled edge 34 has been cut along the leading edge of the contact finger 14. In addition, in this configuration, section C lays across and is in electrical contact with circuit elements 53 which are connected to each contact finger 14.

After sections 1 and 2 have been removed, the assembly is ready for the stripping of the layer of lead-tin alloy 22 from the contact fingers 14. As described hereinabove with respect to the use of composite tape 10, section 3 substantially prevents the stripping of the lead-tin 22 from the circuit intelligence 18, except for an irregular portion thereof due to undercutting at the edge 3′. As before, after the stripping operation is completed and the board 11 is rinsed and dried, section 3 is pulled out and section 4 pressed down to the top surface of the board 11. This provides the automatic set back of tape which enables plating overlap 36 to cover the exposed copper 28 due to the undercutting. Prior to the electro-plating operation, the external power source is electrically connected to section C. The board 11 is then immersed into the plating baths up to edges 4′ and 5′, with the power turned on. Electro-plating of the contact fingers 14 takes place by virtue of the energizing of the contact fingers 14 through section C and the plating bath.

Figure 16:
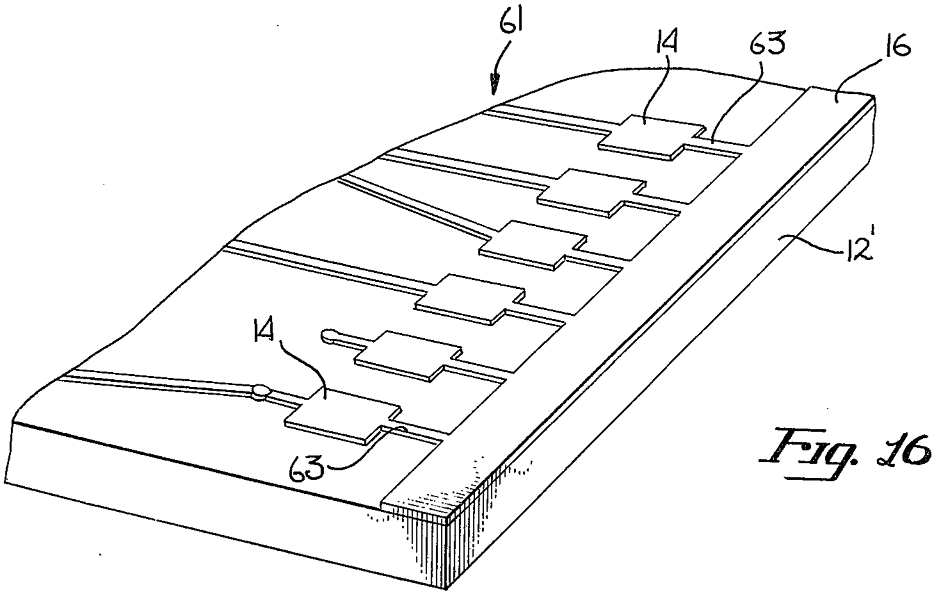
FIG. 16 is a front perspective view of a portion of a circuit board whose contact fingers are reset from its edge.

Conductive tape embodiments of the present invention, such as composite tape 50, may also be used advantageously in circuit board applications wherein the contact fingers 14 are reset from the edge 12′ as in the case of circuit board 61, shown in FIG. 16. By the methods of the prior art, buss region 16 is required for electrical conduction, and a plurality of interconnecting circuit 63 are required in order to electrically connect each contact finger 14 to the buss region 16. One objective of reset contact fingers 14 is to reduce the exposure of copper along edge 12′ after the buss region 16 is cut off. The use of reset contact fingers, while reducing the exposure of copper, does not eliminate it entirely because, after the buss region 16 is cut off, the copper edge of each interconnecting circuit 63 is exposed.

By use of a conductive tape embodiment of this invention, electrical conduction to the contact fingers 14 is provided by section C. This eliminates entirely the need for a buss region 16 and for interconnecting circuits 63. Thus, circuit boards, with reset contact fingers 14, can be produced with no exposed copper whatsoever at the leading edges of the contact fingers 14.

Figure 17:
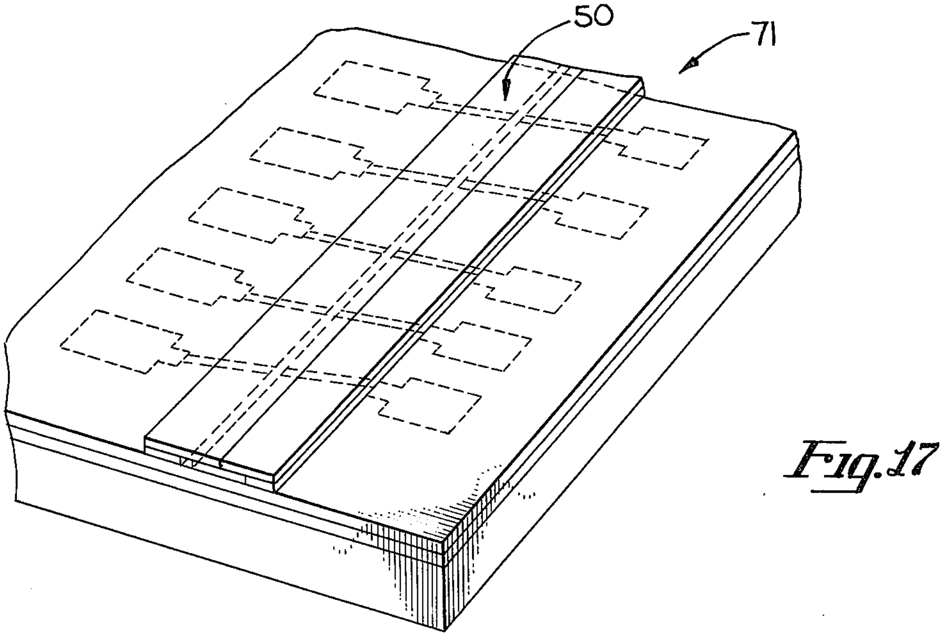
FIG. 17 is a front perspective view of a portion of a circuit board showing the manner in which the present invention may be used in electro-plating an electrically isolated region thereof.

Conductive embodiments of the present invention are also highly advantageous in electro-plating applications wherein the regions to be plated are internal, electrically isolated or otherwise inaccessible to convenient electrical connection. The laying of a conductive tape across such an inaccessible region, or across internal printed circuitry, immediately solves the problem of electrical contact to an external power source by virtue of the conducting section C which is integral to the tape. This is a far superior solution to the problem than that heretofore used in the prior art, including the use of conductive silver "inks" or the multiple exposures, printing and etching required in order to achieve a gold layer over an internal region. FIG. 17 illustrates the use of a conductive embodiment of this invention, such as composite tape 50, for electro-plating an electrically isolated region of a circuit board 71.

In describing the subject invention and its method of use, no distinction was made as to how the composite tape is laid down on the circuit board. Obviously, it can be done manually from previously assembled rolls of composite tape. It should be understood, however, that the composite tape disclosed herein may also be assembled and laid down mechanically in a concurrent operation. In the latter mode of operation, rolls of commercially available plastic tape (and copper foil, if the tape is to be conductive) are rolled across accurately located slitters. By properly designed mechanical means, the sections of tape cut by the slitters can be aligned to very close tolerances and assembled into composite tape prior to being laid down on the circuit boards. The laying down of the composite tape on the board can be done mechanically by means of prelocated line-up pins on the board.

Although this invention has been disclosed and described with reference to several particular embodiments and applications, the principles involved will be susceptible to other applications to persons skilled in the art. It will be understood by those skilled in the art that various changes in form, detail and application of the present invention may be made thereto without departing from the spirit and scope of the invention. This invention, therefore, is not intended to be limited to the particular embodiments and methods of use herein described.

I claim:

1. A composite plating tape comprised of a tape configured in at least two layers, each of said layers being comprised of a plurality of sections of adhesive tape, said sections of tape being held in stable spatial relation with respect to one another by the adhesiveness of the adjoining surfaces of said sections of tape, the line of engagement between each pair of said adjacent sections of tape being located within the surface area of at least one other of said sections of tape which is disposed in an immediately adjacent layer thereof, whereby the adhesion between the surfaces of said pair of adjacent sections and said other section of tape keeps said adjacent sections of tape from disengaging, said sections of tape comprising each layer thereof being disposed adjacent to and in adhesion with one another in a direction transverse to their longitudinal direction, whereby the sequential removal of some of said sections of tape provides, sequentially, appropriately spaced tape sections required as barriers in a process for stripping a first metal from a surface and for replating said surface with said second metal.

2. The composite tape of claim 1 wherein said sections of tape are made of a waterproof, acid-resistant plastic.

3. The composite tape of claim 1 having in addition thereto at least one strip of electrically conductive material disposed between two of said sections of tape, said strip of material being held in stable spatial relation with respect to said two sections of tape by adhering to the surface of at least one other of said sections of tape which is disposed in an immediately adjacent layer thereof and in surface contact therewith, whereby said strip of material enables the electrical connection of an external source of electrical power to said surface to be plated.

4. The composite tape of claim 1 having first, third and fifth adjacent sections comprising a lower layer thereof and second and fourth adjacent sections comprising an upper layer thereof, said upper and lower layers being of substantially equal width, the interior edge of said fourth section being set back from the edge of said third section which is adjacent said first section by the amount of plating overlap required in said process, whereby the removal of said first and second sections enables the use of said third section as a barrier during the stripping step of said process and the subsequent removal of said third section enables the use of said fourth section as a barrier during the plating step thereof.

5. The composite tape of claim 1 having first, third, fifth and seventh adjacent sections comprising a lower layer thereof and second, fourth and sixth adjacent sections comprising an upper layer thereof, said upper and lower layers being of substantially equal width, the interior edge of said sixth section being set back from the edge of said fifth section, which is adjacent said third section by the amount of plating overlap required in said process, and the width of said first section being sufficient to substantially cover an electrical buss region of the item containing said surface to be stripped and plated, whereby the removal of said third and fourth sections enables the use of said fifth section as a barrier during the stripping step of said process and the subsequent removal of said fifth section enables the use of said sixth section as a barrier during the plating step thereof, and said first section acts as a barrier to the stripping and plating of said buss region.

6. A composite plating tape comprised of:

a. a tape having first and second layers, each of said layers being comprised of plurality of sections of adhesive tape; and b. at least one strip of electrically conductive material disposed between two of said sections of tape, said sections of tape and said strip of material being held in stable spatial relation with respect to one another by the adhesiveness of the adjoining surfaces of said sections of tape, the line of engagement between each pair of said adjacent sections of tape being located within the surface area of at least one other of said sections of tape which is disposed in an immediately adjacent layer thereof, whereby the adhesion between the surfaces of said pair of adjacent sections and said other section of tape keeps said adjacent sections of tape from disengaging, said sections of tape comprising each layer thereof being disposed adjacent to and in adhesion with one another in a direction transverse to their longitudinal direction, whereby the sequential removal of some of said sections of tape provides, sequentially, appropriately spaced tape sections required as barriers in a process for stripping a first metal from a surface and for replating said surface with a second metal, and said strip of conductive material enables the electrical connection of an external source of electrical power to said surface to be plated.

7. A composite plating tape comprised of first, second, third, fourth and fifth sections of tape, said tape being a water-proof, acid-resistant adhesive plastic, said first, third and fifth sections thereof being located adjacent to one another in that order in a direction transverse to their longitudinal direction and forming a lower layer of said composite tape, said second and fourth sections thereof being located adjacent to one another in said transverse direction and forming an upper layer of said composite tape, the lateral edges of said first and second sections on one side, and the lateral edges of said fourth and fifth sections on the other side forming first and second planar edges, respectively, of said composite tape, the longitudinal line of engagement between said first and third sections being located within the surface area of said second section, the longitudinal line of engagement between said third and fifth sections being located within the surface area of said fourth section, and the longitudinal line of engagement between said second and fourth sections being located within the surface area of said third section, the adhesiveness of said tape maintaining said sections in stable spatial relation to one another, the interior edge of said fourth section being set back from the edge of said third section which is adjacent said first section, whereby the removal of said first and second sections enables the use of said third section as a barrier during the stripping of a first metal from the contact fingers of a printed circuit board, the subsequent removal of said third section enables the use of said fourth section as a barrier during the replating of said contact fingers with a second metal, said second metal overlapping said first metal by the amount of said set back.

8. The composite plating tape of claim 7 having in addition thereto a strip of copper foil disposed between said third and fifth sections of tape, said strip of copper being held in stable space relation with respect to said third and fifth sections by the adhesiveness of the surface of said fourth section, whereby said strip of copper enables the electrical connection of said contact fingers to an external source of electrical power during said electro-plating thereof.

9. The composite plating tape of claim 7 having in addition thereto sixth and seventh sections of tape, said sixth section being disposed adjacent to said second section in said upper layer thereof and said seventh section being disposed adjacent to said first section in said lower layer thereof, the lateral edges of said sixth and seventh sections forming said first planar edge of said composite tape, the longitudinal line of engagement between said first and seventh sections being located within the surface area of said second section and the longitudinal line of engagement between said second and sixth sections being located within the surface area of said seventh section, the width of said seventh section being sufficient to substantially cover an electrical buss region of said circuit board, whereby said seventh section acts as a barrier to the stripping and replating of said buss region.

10. The composite plating tape of claim 7 wherein the width of said seventh section thereof is sufficient to cover said buss region entirely and approximately 1/16–⅛ inch of said contact fingers.

* * * * *